(12) United States Patent
Miyahara et al.

(10) Patent No.: US 7,759,844 B2
(45) Date of Patent: Jul. 20, 2010

(54) SURFACE-MOUNT TYPE CRYSTAL UNIT

(75) Inventors: Itaru Miyahara, Saitama (JP); Katsunori Akane, Saitama (JP)

(73) Assignee: Nihon Dempa Kogyo Co., Ltd., JPX ( * ) Notice: Subject to any disclaimer, the term of this patent is extended or adjusted under 35 U.S.C. 154(b) by 103 days.

(21) Appl. No.: 12/035,027

(22) Filed: Feb. 21, 2008

(65) Prior Publication Data

US 2008/0197755 A1 Aug. 21, 2008

(30) Foreign Application Priority Data

Feb. 21, 2007 (JP) .............................. 2007-041084

(51) Int. Cl.
*H01L 41/053* (2006.01)
(52) U.S. Cl. .................................. 310/348
(58) Field of Classification Search ................. 310/340, 310/344, 346, 348; 331/158, 160–164
See application file for complete search history.

(56) References Cited

U.S. PATENT DOCUMENTS 6,967,537 B2 * 11/2005 Harima et al. ............... 331/68
2005/0269911 A1 * 12/2005 Usuda ......................... 310/348
2007/0024161 A1 * 2/2007 Koyama et al. ............. 310/348

FOREIGN PATENT DOCUMENTS

JP 2006-304110 A 2/2006

* cited by examiner

*Primary Examiner*—Walter Benson
*Assistant Examiner*—Derek J Rosenau
(74) *Attorney, Agent, or Firm*—Cantor Colburn LLP

(57) ABSTRACT

A surface-mount type crystal unit includes a package body which is made of a laminated ceramic and has a bottom wall layer and a frame wall formed on the bottom wall layer, the frame wall layer having an opening. In the package body, a concavity is constructed of the opening. The crystal unit further includes a pair of crystal holding terminals formed on one end part of the inner bottom surface of a concavity which is a top face of the bottom wall layer; a crystal blank held in the concavity by fixing the both sides of the one end part of the crystal blank to the pair of crystal holding terminals; a thermistor; and a cover which closes the concavity. The thermistor is arranged in a hollow part arranged in the top face of the bottom wall layer in the concavity.

4 Claims, 2 Drawing Sheets

SURFACE-MOUNT TYPE CRYSTAL UNIT

BACKGROUND OF THE INVENTION

1. Field of the Invention

The present invention relates to a surface-mount type crystal unit, and in particular, to a surface-mount type crystal unit preferably used for a temperature compensated crystal oscillator and the like.

2. Description of the Related Art

Since a surface-mount type quartz crystal unit in which a quartz crystal blank is hermetically sealed in a surface-mounting package is small and lightweight, for example, it is incorporated in a crystal oscillator as a reference source of a frequency or time in portable electronic equipment. By detecting operating temperature of a crystal unit and compensating a frequency change on the basis of a frequency-temperature characteristic of the crystal unit, a temperature compensated crystal oscillator among such crystal oscillators supplies an oscillation signal at a fixed frequency regardless of a change of the ambient temperature. FIG. 1 illustrates construction of an example of a conventional temperature compensated crystal oscillator, and FIG. 2 illustrates a typical crystal blank used in a crystal unit. The temperature compensated crystal oscillator illustrated in FIG. 1 is a surface-mount type one which can be surface-mounted on a wiring board.

The shown temperature compensated crystal oscillator is constructed by bonding surface-mount type crystal unit 1 to mount substrate 2. Crystal unit 1 accommodates crystal blank 4 in package body 3 which is made of laminated ceramic, and in which a concavity is formed in one principal surface. In package body 3, frame wall layer 3b which has a rectangular opening in a center part is stacked on approximately rectangular bottom wall layer 3a, and the concavity for accommodating crystal blank 4 is formed of the opening of frame wall layer 3b. Hence, an inner bottom surface of the concavity of package body 3 is a portion where a top face of bottom wall layer 3a is exposed. In the inner bottom face of such concavity 10, one pair of crystal holding terminals 5 is provided in positions of both ends of one side of the inner bottom face with approaching each other. One pair of external terminals 6 is formed on an outer bottom surface of package body 3, that is, another principal surface of package body 3. Crystal holding terminals 5 are connected to external terminals 6 electrically through conduction paths formed on a stacking surface of bottom wall layer 3a and frame wall layer 3b in package body 3. External terminal 6 electrically connected to crystal holding terminals 5 is provided, for example, in one diagonal part of the outer bottom surface of package body 3, and external terminal 6 for grounding is provided in another diagonal part.

As shown in FIG. 2, for example, crystal blank 4 is an AT-cut quartz crystal blank having an approximately rectangular shape, and excitation electrodes 7 are formed in both of principal surfaces thereof, respectively. Each extending electrode 8 is extended toward both sides of the one end part of crystal blank 4 from the pair of excitation electrodes 7. In a position of the end part of crystal blank 4, extending electrodes 8 are formed so as to fold back between both principal surfaces of crystal blank 4. Crystal blank 4 is fixedly held in the concavity of package body 3 by fixing these extending electrodes 8 to crystal holding terminals 5 with, for example, electrical conductive adhesive 9 or the like in the positions, where the pair of extending electrodes 8 are led, respectively, and are then connected to external terminals 6 electrically.

A metal ring (not shown) which surrounds the concavity in package body 3 is provided on the top face, that is, the open end surface, of frame wall layer 3b of package body 3, and metal cover 10 is bonded to the metal ring by seam welding. Thereby, crystal blank 4 is hermetically sealed in the concavity.

Similarly to package body 3, mount substrate 2 is also made of laminated ceramics formed in a concavity. In an inner bottom surface of the concavity of mount substrate 2, IC (integrated circuit) chip 11 is fixed, for example, by flip-chip bonding, and thereby, IC chip 11 is accommodated in the concavity. At least an oscillation circuit which uses crystal blank 4, and a temperature compensation mechanism which compensates a frequency-temperature characteristic of crystal blank 4 are integrated in IC chip 11.

Bonding terminals are formed on a surface of square corners of an open end surface of the concavity of mount substrate 2. These bonding terminals are bonded by soldering or the like to external terminals 6 on the outer bottom surface of package body 3 of crystal unit 1, and thereby, mount substrate 2 and crystal unit 1 are unified. Bonding terminals are electrically connected to IC chip 11 through the conduction paths provided in the mount substrate.

In such a temperature compensated crystal oscillator, ambient temperature is detected by a temperature sensor provided in the temperature compensation mechanism in IC chip 11, the temperature compensation mechanism generates a compensation voltage according to the detected ambient temperature, and the generated compensation voltage is applied to a voltage variable capacitance element provided in an oscillation closed loop of the oscillation circuit. Thereby, since load capacity in a circuit side which is seen from crystal unit 1 as an inductor component changes, a change of an oscillating frequency by temperature is compensated for the oscillating frequency to be kept at a reference frequency (nominal frequency).

However, in the temperature compensated crystal oscillator with the above construction, since IC chip 11 which has the temperature sensor is accommodated in mount substrate 2 and crystal blank 4 which constructs crystal unit 1 is accommodated in package body 2, both are arranged in different spaces respectively. In addition, since generating heat by active elements, such as an oscillation amplifier which forms the oscillation circuit, IC chip 11 becomes at temperature higher than environmental temperature of crystal blank 4. Hence, since detection temperature by the temperature sensor in IC chip 11 becomes different from actual operating temperature of crystal blank 4, a problem that the frequency-temperature characteristic of the crystal unit cannot be sufficiently compensated arises.

Japanese Patent Laid-Open No. 2006-304110 (JP-A-2006-304110) discloses a temperature compensation crystal oscillation module in which a crystal unit and a thermistor for temperature detection are arranged on one principal surface of a ceramic substrate, and an IC chip is arranged on the other principal surface. In this crystal oscillation module, although an influence of heat generation of the IC chip is reduced since the thermistor for temperature detection is separately arranged from the IC chip, the thermistor is arranged in the external of the crystal unit, and hence, strictly speaking, it is not possible to detect the actual operating temperature of the crystal unit exactly, and it is not possible to compensate further adequately the frequency-temperature characteristic accordingly.

SUMMARY OF THE INVENTION

Then, an object of the present invention is to provide a surface-mount type crystal unit which can detect operating temperature of the crystal unit (i.e., crystal blank) exactly, and can compensate sufficiently a frequency-temperature characteristic when being incorporated in a temperature compensated crystal oscillator or the like.

The surface-mount crystal unit of the present invention is suitably used for incorporating, for example, in a temperature compensated crystal oscillator or the like, and has construction of accommodating a thermistor as a temperature sensor, and a crystal blank in the same package.

That is, the surface-mount type crystal unit of the present invention includes: a package body which is made of a laminated ceramic, and has a bottom wall layer and a frame wall layer formed on the bottom layer, the frame wall layer having an opening, wherein a concavity is constructed of the opening; a pair of crystal holding terminals formed on one end part of an inner bottom surface of the concavity which is a top face of the bottom wall layer; a crystal blank having excitation electrodes formed in both of principal surfaces thereof, respectively, and extending electrodes extended from the excitation electrodes toward both sides of one end part of the crystal blank, the crystal blank being held in the concavity by fixing the both sides of the one end part of the crystal blank to the pair of crystal holding terminals; a thermistor used as a temperature sensor; and a cover which is bonded to a top face of the frame wall layer, and closes the concavity, wherein the thermistor is arranged in a hollow part arranged in the top face of the bottom wall layer in the concavity.

According to this configuration, since a crystal blank and a thermistor are accommodated in the same package body, operating temperature of a crystal unit can be detected exactly.

Generally, a thermistor is a tall electronic part in comparison with a necessary interval from a surface of a crystal blank to an inner bottom surface of a concavity, and to a cover. When such a thermistor is arranged as it is in the inner bottom surface of the concavity, it is necessary to enlarge a space between the inner bottom surface of the concavity and the cover, and hence, swing width of the other end part of the crystal blank becomes large when mechanical vibration is applied to the crystal blank. When the swing width of the other end part becomes large, a large stress is applied to a holding system of the electrical conductive adhesive and the like which fixes the crystal blank to the crystal holding terminals, and hence, there is a possibility of causing a change of an oscillating frequency, and the like. Then, in the present invention, it is preferable not only to stack two or more layers to construct the bottom wall layer, but also to make the other end part of the crystal blank face a top layer of the bottom wall layer, and to make the top layer removed at least in the hollow part. According to such construction, it is possible not only to reduce the interval between the inner bottom surface of the concavity, and the cover in a position of the other end part of the crystal blank, but also to arrange the other end part of the crystal blank in a midrange between the inner bottom surface and cover, and to make the swing width of the other end part of the crystal blank small and equal vertically.

DETAILED DESCRIPTION OF THE EMBODIMENTS

First Embodiment

Figure 1:
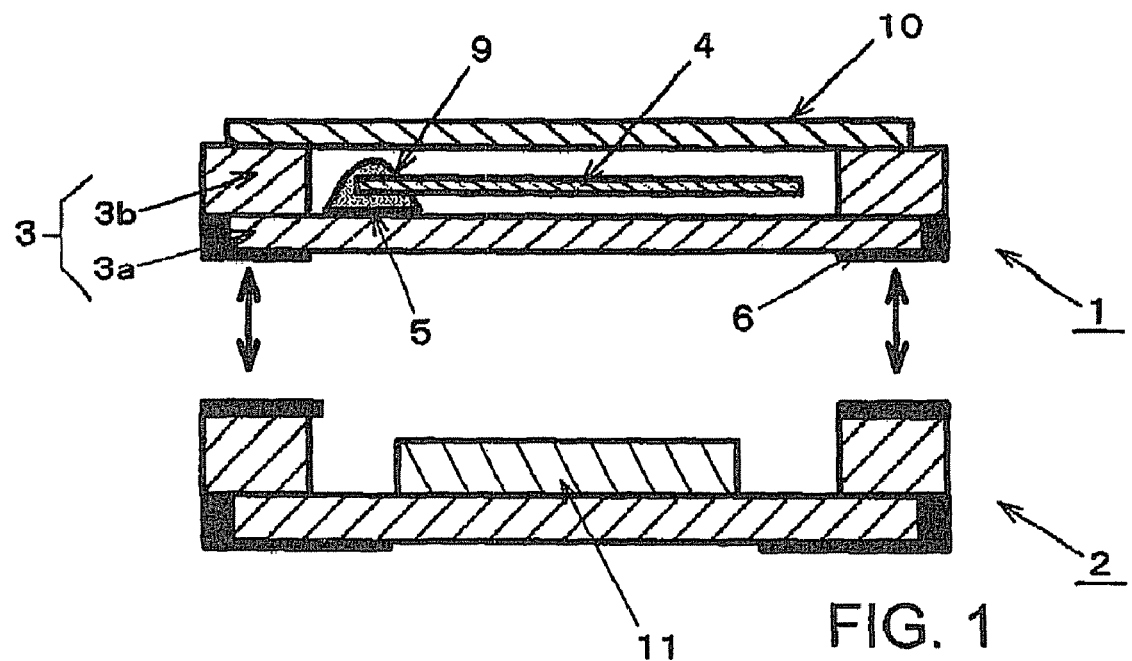
FIG. 1 is an assembly sectional view illustrating an example of construction of a surface-mount type temperature compensated crystal oscillator in a related art.
Figure 2:
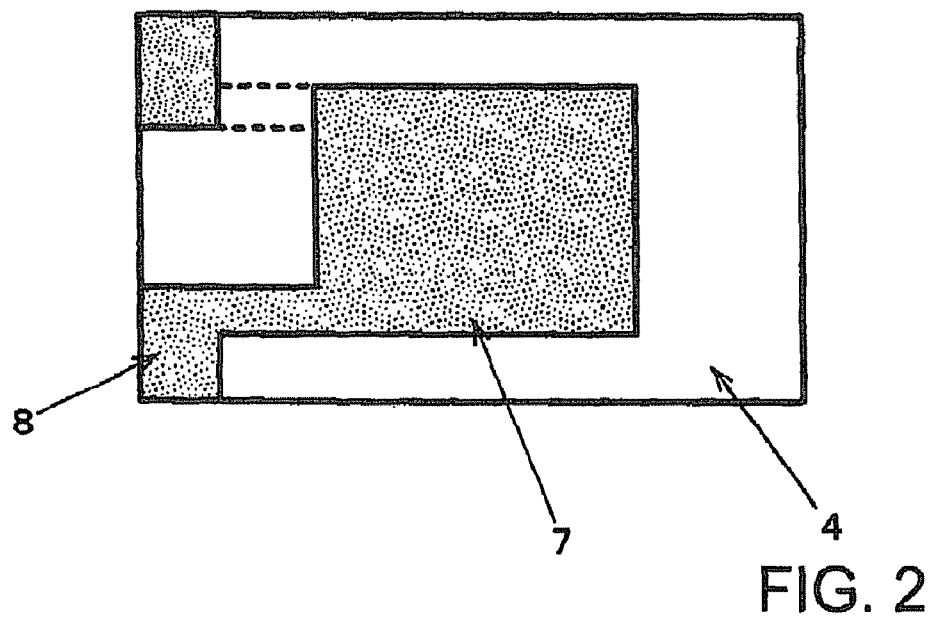
FIG. 2 is a top view illustrating a typical crystal blank.
Figure 3A:
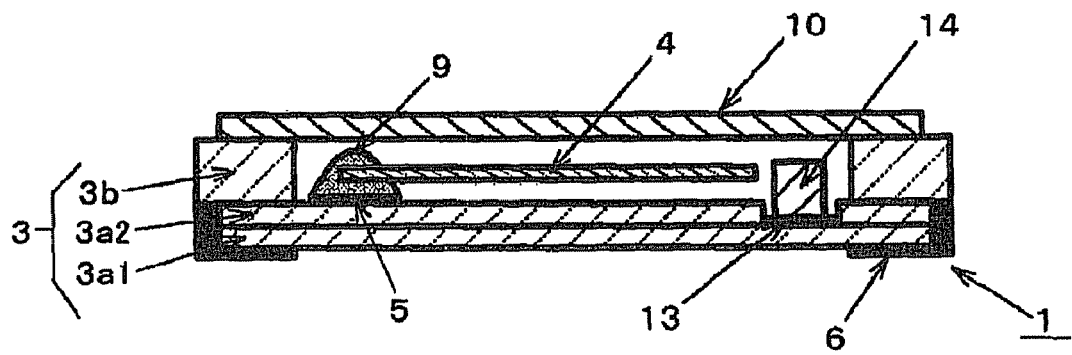
FIG. 3A is a sectional view illustrating construction of a surface-mount type crystal unit according to a first embodiment of the present invention.
Figure 3B:
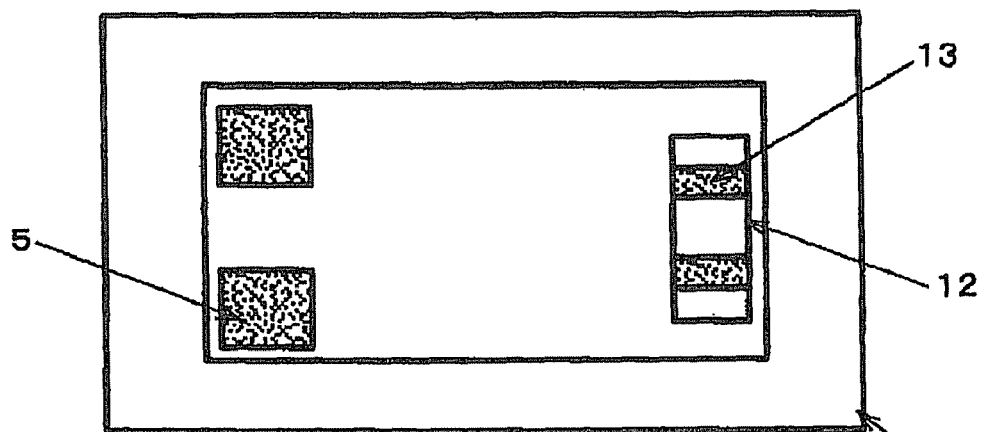
FIG. 3B is a top view of a package body.

In FIGS. 3A and 3B illustrating the crystal unit of the first embodiment of the present invention, the same reference symbols are assigned to the same components as those in FIGS. 1 and 2, and duplicated descriptions about these will be simplified or omitted.

The surface-mount type crystal unit illustrated in FIGS. 3A and 3B is suitably used for incorporating in a temperature compensated crystal oscillator and hermetically seals crystal blank 4 in a concavity by accommodating crystal blank 4 in the concavity of package body 3 and covering metal cover 10 to the concavity. As mentioned above, package body 3 is constructed of a laminated ceramic, and has bottom wall layer 3a and frame wall layer 3b which has an opening and is formed on bottom wall layer 3a, and in which the concavity is constructed of the opening.

External terminals 6 are formed on an outer bottom surface of package body 3, that is, square corners of a bottom surface of bottom wall layer 3a, respectively.

Here, bottom wall layer 3a is constructed by stacking two or more layers, for example, two layers 3a1 and 3a2. Hollow part 12 communicating with the concavity is formed by forming a through-bore only in top layer 3a2 in a position further external than a position corresponding to the other end part of crystal blank 4. In other words, hollow part 12 is formed in a position which is away from a region which is directly under a bottom surface of crystal blank 4, the position which is adjacent to the other end part of crystal blank 4. A pair of circuit terminals 13 are formed in hollow part 12 as shown in FIG. 3B, and are connected to external terminals 6 formed in both corners in the other end side of the outer bottom surface of package body 2, respectively. One of external terminals 6 is an external terminal for grounding. Then, in hollow part 12, thermistor 14 which is a chip type element or chip type electronic part is arranged by being bonded to the pair of circuit terminals 13. FIG. 3B is a top view of package body 2 without the illustration of crystal blank 4 and thermistor 14.

The same one as that illustrated in FIG. 2 is used as crystal blank 4. As for crystal blank 4, similarly to the above-described, both sides of the one end part toward which extending electrodes 8 are extended are fixed with electrical conductive adhesive 9 to the pair of crystal connecting terminals 5 formed in the inner bottom surface of the concavity of package body 3. The other end part of crystal blank 4 faces top layer 3a2 of bottom wall layer 3a. Crystal connecting terminals 5 are connected to external terminals 6 in the both sides of the other end part in the outer bottom surface. Metal cover 10 is bonded to the metal ring (not shown) which is provided on the top face of frame wall layer 3b, by seam welding, and closes the concavity. Metal cover 10 is electrically connected to external terminal 6 for grounding by a through-hole or the like provided in frame wall layer 3b.

Similarly to the above-described one, this surface-mount type crystal unit 1 constructs a temperature compensated crystal oscillator by being bonded to a mount substrate equipped with an IC chip.

In this crystal unit 1, since being accommodated in the same concavity of package body 3 with crystal blank 4, thermistor 14 can exactly detect actual operating temperature of the crystal unit (i.e., crystal blank 4). Thermistor 14 is provided in hollow part 12 which is formed in the other end part in the inner bottom surface of the concavity of package body 3, and is arranged in a position further external than the other end part of crystal blank 4. Because of this construction, the other end part of crystal blank 4 can be arranged in a midrange between the inner bottom surface of package body 2, and metal cover 10, without enlarging a space between the inner bottom surface of the concavity, and metal cover 10. Hence, even if the other end part of crystal blank 4 swings up and down by an external shock being applied to crystal unit 1 or the like, it is possible to make swing width of the other end part of crystal blank 4 to the inner bottom surface and metal cover 10 small and equal.

In addition, height of thermistor 14 is, for example, about 0.4 mm and this is distinctly larger than thickness of crystal blank 4. Assuming an AT cut crystal blank whose vibration frequency is 19.2 MHz, its thickness is about 85 μm. In the case that the thermistor is provided in the inner bottom surface of the concavity without providing hollow part 12, supposing the other end part of crystal blank 4 is arranged in a midrange between the inner bottom surface of the concavity, and metal cover 10, a space between the inner bottom surface and metal cover 10 becomes large, a clearance from the crystal blank to the inner bottom surface or metal cover 10 becomes large, and hence, the swing width of the other end part of the crystal blank becomes large. In this case, as the swing width of the other end part of the crystal blank becomes large, a stress generated in electrical conductive adhesive 9 which fixes both sides of the one end part of crystal blank 4 to crystal holding terminals 5 becomes large, the stress affects a holding system of crystal blank 4, and a vibration frequency of crystal blank 4 is changed.

In this embodiment, by grounding one of the pair of terminals of thermistor 14, this terminal of the thermistor is connectable to the external terminal for grounding metal cover 10. Hence, the number of external terminals 6 provided in crystal unit 1 can be suppressed to four pieces similarly to those in a related art.

Second Embodiment

Figure 4:
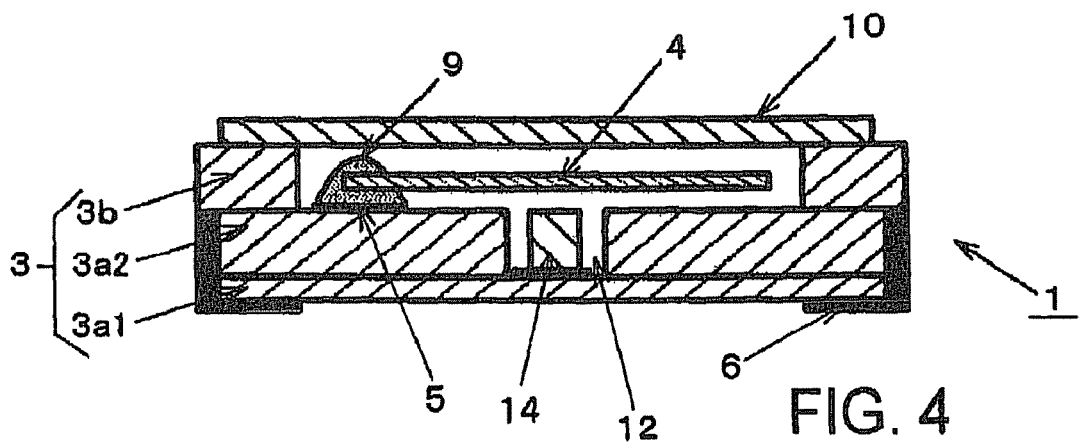
FIG. 4 is a sectional view illustrating construction of a surface-mount type crystal unit according to a second embodiment of the present invention.

In FIG. 4 illustrating a crystal unit of the second embodiment of the present invention, the same reference symbols are assigned to the same components as those in FIGS. 3A and 3B, and duplicated descriptions about these will be omitted or simplified.

In crystal unit 1 of the second embodiment, hollow part 12 is provided in a central area of the inner bottom surface in package body 2, and thermistor 14 is arranged in this hollow part 12. Hence, excitation electrode 7 of crystal blank 4 is opposite above hollow part 12. At this time, a top face of thermistor 14 and a top face of top layer 3a2 of bottom wall layer 3a are in an identical level.

According to this construction, since thermistor 14 is arranged in a position nearest to an excitation portion of crystal blank 4, that is, a vibration displacement region, it becomes possible to detect actual operating temperature of crystal blank 4 further exactly. Then, similarly to the first embodiment, since the other end part of crystal blank 4 can be arranged in an intermediate position between the inner bottom surface of the concavity, and metal cover 10, it is possible to make swing width to an impact small.

In the above-described embodiments, although crystal unit 1 is used so as to construct a temperature compensated crystal oscillator by being bonded to a mount substrate equipped with an IC chip, applications of the surface-mount type crystal unit according to the present invention is not limited to this. For example, also when various kinds of circuits, such as an oscillation circuit, are constructed by directly mounting a crystal unit on a tabular wiring board on which a plurality of electronic parts are mounted, it is possible to use the crystal unit according to the present invention.

What is claimed is:

1. A surface-mount type crystal unit, comprising:
   a package body which is made of a laminated ceramic, and has a bottom wall layer and a frame wall layer formed on the bottom layer, the frame wall layer having an opening, wherein a concavity is constructed of the opening;
   a pair of crystal holding terminals formed on one end part of an inner bottom surface of the concavity which is a top face of the bottom wall layer;
   a crystal blank having excitation electrodes formed in both of principal surfaces thereof, respectively, and extending electrodes extended from the excitation electrodes toward both sides of one end part of the crystal blank, the crystal blank being held in the concavity by fixing the both sides of the one end part of the crystal blank to the pair of crystal holding terminals;
   a thermistor used as a temperature sensor; and
   a cover which is bonded to a top face of the frame wall layer, and closes the concavity to form a closed space defined by the concavity and the cover,
   wherein the thermistor is arranged in a hollow part arranged in the top face of the bottom wall layer in the concavity so that the hollow part constitutes a portion of the closed space, and the crystal blank and the thermistor are enclosed in the closed space, and
   wherein no active element is contained in the closed space.

2. The crystal unit according to claim 1, wherein the bottom wall layer is constructed by stacking two or more layers, the other end part of the crystal blank faces a top layer of the bottom wall layer, and the top layer is removed at least in the hollow part.

3. The crystal unit according to claim 2, wherein the hollow part is formed in a position which is away from a region directly under the crystal blank, the position being adjacent to the other end part of the crystal blank.

4. The crystal unit according to claim 2, wherein the hollow part is formed in a position which becomes directly under the crystal blank.

* * * * *